United States Patent
Chettuvetty et al.

(10) Patent No.: US 9,520,888 B1
(45) Date of Patent: Dec. 13, 2016

(54) INTEGRATED CIRCUIT DEVICE WITH ON-BOARD CALIBRATION OF SIGNAL GENERATOR CIRCUITS, AND RELATED METHODS

(71) Applicant: Cypress Semiconductor Corporation, San Jose, CA (US)

(72) Inventors: Ramesh Chettuvetty, Bengaluru (IN); Sonal Chandrasekharan, Bengaluru (IN); Andrew J. Wright, Fremont, CA (US); Hiromu Takehara, Tokyo (JP); Ashok Kumar, Bengaluru (IN); Tushar Kachhdiya, Raleigh, NC (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/087,573

(22) Filed: Mar. 31, 2016

Related U.S. Application Data

(60) Provisional application No. 62/196,489, filed on Jul. 24, 2015, provisional application No. 62/286,818, filed on Jan. 25, 2016.

(51) Int. Cl.
| | |
|---|---|
| *H03L 7/06* | (2006.01) |
| *H03L 7/10* | (2006.01) |
| *H03L 7/089* | (2006.01) |
| *H03L 7/091* | (2006.01) |

(52) U.S. Cl.
CPC ............. *H03L 7/103* (2013.01); *H03L 7/0891* (2013.01); *H03L 7/091* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 6,025,695 A | 2/2000 | Friel et al. | |
| 6,188,290 B1 * | 2/2001 | Fallisgaard | H03B 5/366 |
| | | | 327/156 |
| 6,954,706 B2 | 10/2005 | Poirier et al. | |

(Continued)

FOREIGN PATENT DOCUMENTS

| | | |
|---|---|---|
| WO | 9714128 | 4/1997 |
| WO | 2012097065 A1 | 7/2012 |
| WO | 2014164216 A1 | 10/2014 |

OTHER PUBLICATIONS

"Intel® Celeron® Processor 200 Sequence—Thermal and Mechanical Design Guidelines", Intel Corporation, dated Oct. 2007; 53 pages.

(Continued)

*Primary Examiner* — Adam Houston

(57) ABSTRACT

An integrated circuit (IC) device can include at least one phase or delay lock loop (P/DLL) circuit comprising a plurality of circuit sections, at least one of the circuit sections responsive to digital calibration values to alter at least one periodic output signal; a nonvolatile memory (NVM) circuit formed in the same IC package as the at least one P/DLL circuit and configured to store the calibration values; and a processing circuit formed in the same IC package as the at least one P/DLL circuit and the NVM circuit, the processing circuit configured to generate the calibration values in response to target values and output values from the at least one P/DLL circuit, and to store the calibration values in the NVM circuit.

20 Claims, 11 Drawing Sheets

(56) References Cited

U.S. PATENT DOCUMENTS

| | | | |
|---|---|---|---|
| 8,643,519 B1 | 2/2014 | Kutz et al. | |
| 2003/0076139 A1* | 4/2003 | Miyagawa | H03C 3/0925 |
| | | | 327/156 |
| 2003/0179026 A1* | 9/2003 | Alexander | H03L 7/0814 |
| | | | 327/158 |
| 2003/0224747 A1 | 12/2003 | Anand | |
| 2006/0189901 A1 | 8/2006 | Flaherty et al. | |
| 2012/0286835 A1* | 11/2012 | Yamada | H03L 1/00 |
| | | | 327/156 |
| 2013/0232330 A1 | 9/2013 | Maiolani et al. | |
| 2015/0222278 A1* | 8/2015 | Reichelt | H03L 7/18 |
| | | | 327/156 |
| 2016/0126964 A1* | 5/2016 | Huang | G06F 13/4282 |
| | | | 710/105 |

OTHER PUBLICATIONS

Atmel Corporation, "AT08774: SAM D20 PTC with I2C Slave", Application Note, dated Apr. 2016; 42 pages.

Eamon Nash, "RF Power Calibration Aids Wireless Transmitters", published in Microwaves and RF at http://mwrf.com/markets/rf-power-calibration-aids-wireless-transmitters, dated Feb. 13, 2008; 4 pages.

Maxim Integrated, "In-System Calibration with the 78M6610+PSU Energy Measurement Processor", Application Note 5596, dated Jun. 21, 2013; 13 pages.

\* cited by examiner

INTEGRATED CIRCUIT DEVICE WITH ON-BOARD CALIBRATION OF SIGNAL GENERATOR CIRCUITS, AND RELATED METHODS

This application claims the benefit of U.S. provisional patent application Ser. No. 62/196,489 filed on Jul. 24, 2015 and of U.S. provisional patent application Ser. No. 62/286,818 filed on Jan. 25, 2016, the contents of all of which are incorporated by reference herein.

TECHNICAL FIELD

The present disclosure relates generally to integrated circuit (IC) devices for generating timing signals, and more particularly to IC devices that include delay lock loop and/or phase lock loop circuits that can be calibrated to generate output signals having particular frequencies.

BACKGROUND

High performance programmable clock integrated circuits (ICs) can require precise control of active and passive components on chip to accurately define the design parameters. However, IC fabrication processes can introduce uncontrollable variations in such on-chip active and passive components. Conventionally, post fabrication steps, such as trimming, are used to finely tune circuit components to arrive at a desired performance. A drawback to such conventional approaches can be the additional post-fabrication steps, including additional test time, and/or complex analog calibration techniques needed to determine the changes (e.g., trimming) required. This can add cost to a resulting device, as well as complexity to the overall manufacturing process.

Other conventional approaches to addressing component variation can include large and/or complex analog circuits designed to accommodate anticipated variation in on-chip components. Such "over-designing" can also add to the cost and/or size of a resulting device, and can lead to lower yields when the device is fabricated.

DETAILED DESCRIPTION

Figure 1:
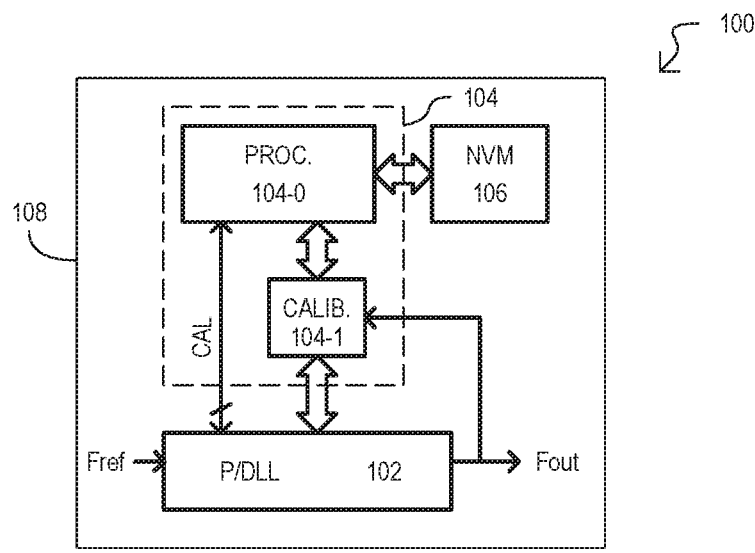
FIG. 1 is a block diagram of an integrated circuit (IC) device according to an embodiment.

Embodiments can include systems and integrated circuit (IC) devices and methods in which a signal generating circuit can be calibrated using processor circuits formed on the same IC device, with the processor circuits using calibration values stored in a nonvolatile memory (NVM) also formed on the same IC device. According to some embodiments, calibration values can be used to compensate for variations in device performance arising from manufacturing and/or operating conditions.

In some embodiments, a device can include a phase or delay lock loop (P/DLL) circuit having one or more circuit sections that can be calibrated by application of calibration values. A processing circuit can execute calibration routines to arrive at calibration values for a desired P/DLL circuit performance.

In particular embodiments, a processing section can execute calibration operations which can calibrate any of: an open-loop frequency generated by the P/DLL; a current generated by a charge pump circuit (e.g., a charge pump driven by a phase or frequency detector (PFD) circuit); resistor-capacitor (RC) networks (e.g., an RC network in a low pass filter for generating a phase/frequency difference voltage); or a loop gain of the P/DLL circuit.

Programmability with such calibration values can enable a device to accommodate various design parameters, thus allowing the same product to be used with different configurations and for different end applications.

In some embodiments, devices and methods can include processing circuits, which may or may not include a processor, to perform calibration routines at power-up that can enable a device to operate at, or near, a center of variations introduced by processing or operating environment. As a result, a device can avoid post fabrication steps, such as trimming, and not require an "over-designed" solution.

In some embodiments, by operation of processing circuits, a device can perform on-the-fly changes in calibration settings, to enable a device to rapidly change performance settings. Such calibration setting can be executed in response to external inputs, such as external signals and/or commands received via an interface.

In some embodiments, a device can include multiple calibration engines for calibrating multiple features of a P/DLL circuit. The calibration engine can perform calibrations as part of a P/DLL initialization sequence. In particular embodiments, some or all of the calibration routines can be firmware routines present in a nonvolatile memory of the device.

In the various embodiments described below, like items are referred to the same reference characters but with the leading digit(s) corresponding to the figure number.

FIG. 1 is a block schematic diagram of an IC device 100 according to an embodiment. IC device 100 can include a phase lock loop or delay lock loop (P/DLL) circuit 102, processing section 104, and a nonvolatile memory (NVM) circuit 106. A P/DLL circuit 102 can generate a periodic output signal Fout. An output signal Fout can be varied in response to calibration values CAL receive from processing section 104. In the embodiment shown, a P/DLL circuit 102 can receive an input signal Fref.

A processing section 104 can execute calibration operations on the P/DLL circuit 102 to arrive at a desired output signal Fout. A processing section 104 can include processing circuits 104-0 and calibration circuits 104-1. Processing circuits 104-0 can include logic circuits for executing arithmetic/logic or other operations for arriving at calibration values (CAL). In some embodiments, processing circuits 104-0 can include a processor that can execute stored instructions. However, in other embodiments processing circuits 104-0 can include "hardwired" logic and/or programmable logic.

A processing section 104 can store calibration values CAL in, and retrieve such values from, NVM circuit 106 (for application to P/DLL 102). As will be described in more detail below, in some embodiments a processing section 104 can also receive calibration values CAL from sources external to device 100, and store such values in NVM circuit 106 and/or apply such values to P/DLL circuit 102.

Calibration circuits 104-1 can include circuits used to input or sample operations of the P/DLL circuit 102 (or portions thereof) to enable processing circuits to generate the calibration values CAL. While calibration circuits 104-1 can receive an output Fout of P/DLL circuit 102, calibration circuits 104-1 can also be connected to various sections of the P/DLL circuit 102, to derive or receive performance values for such sections.

According to embodiments, a device 100 can be contained within a single IC package 108. An IC package 108 can be a unitary structure containing one or more ICs, and having a set of input/outputs (I/Os), such as leads, pads, bumps, balls, or any other suitable connection. In a particular embodiment, an IC package 108 can be a single IC substrate, with P/DLL circuit 102, processing section 104, and NVM circuits 106 formed in the same IC substrate.

The generation and application of calibration values (CAL) to adjust the performance of a P/DLL circuit can compensate for variations in circuit components, such as those arising from process variation or the like. Further, different calibration values can be generated for different device "profiles". For example, calibration values for the generation of a signal at one frequency can be different from those for a different frequency. Thus, a device 100 can be calibrated for each application. In some embodiments, a device 100 can switch calibrations in response to commands or other inputs, to re-calibrate with each new profile. In addition or alternatively, a device 100 can calibrate on power-up or reset and/or periodically, to ensure optimal operations for a given application.

Figure 2:
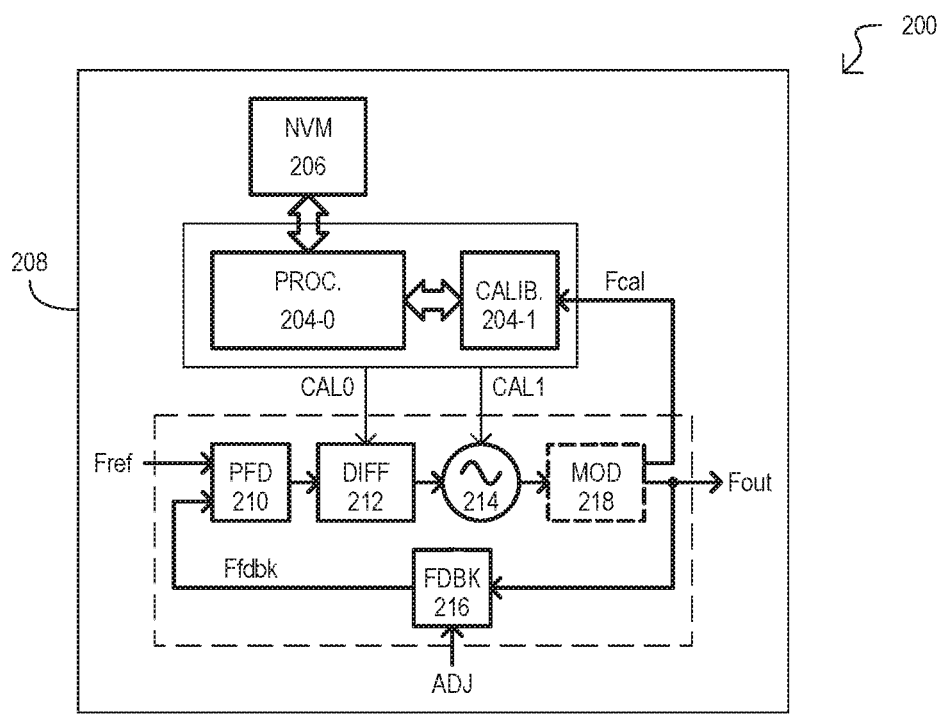
FIG. 2 is a block diagram of an IC device according to another embodiment.

FIG. 2 is a block diagram of a device 200 according to another embodiment. A device 200 can differ from that of FIG. 1 in that it can include a PLL circuit 202 having a phase or frequency detector (PFD) 210, a difference value generator 212, an oscillator 214, and a feedback circuit 216. Optionally, a PLL circuit 202 can further include one or more modifier circuits 218.

PFD 210 can compare phases/frequencies of a reference signal Fref and PLL feedback signal Ffdbk. Difference value generator 212 can generate a difference value that varies according to the detected phase/frequency difference. Oscillator 214 can vary an oscillation frequency in response to a difference value. Feedback circuit 216 can feedback a generated output signal Fout back to PFD 210. In some embodiments, a feedback circuit 216 can be configured by an adjustment value ADJ, to thereby control the output signal Fout. In particular embodiments, a feedback circuit 216 can be frequency divider circuit, or the like, and the amount of frequency division can be controlled by adjustment value ADJ. Modifier circuit(s) 218 can further modify a signal output from oscillator 214 to generate the output signal. Such modifications can include, but are not limited to, frequency division, frequency multiplication, and/or wave shaping.

Calibration circuit 204-1 can receive a calibration signal Fcal output from P/DLL 202, which can be the same as, or related to, output signal Fout.

Referring still to FIG. 2, in the embodiment shown, calibration values can include first calibration values CAL0 and second calibration values CAL1. First calibration values CAL0 can be applied to one or more sections of difference value generator circuit 212. Second calibration values CAL1 can be applied to oscillator 214.

While embodiments can generate calibration values according to any suitable method, in some embodiments, calibration values can be generated in a successive approximation register (SAR) type method. In SAR methods, bits of a multi-bit calibration value can be generated by comparing a P/DLL value to target/reference values. In some embodiments, bits can be generated starting with a most significant bit (MSB), then proceeding with each lesser significant bit. Target/reference values can change with each comparison.

Figure 3:
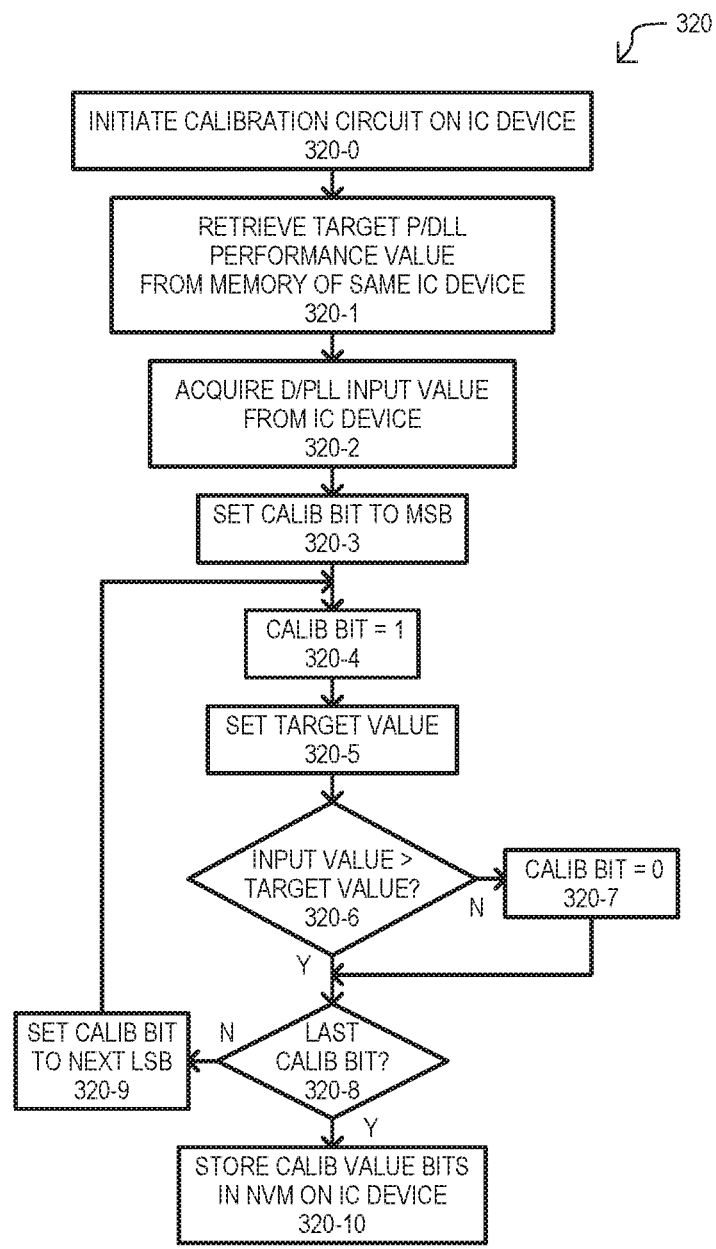
FIG. 3 is a flow diagram of a method of generating calibration bit values according to an embodiment.

FIG. 3 is a flow diagram of a method 320 according to one particular embodiment. A method 320 can include initiating a calibration circuit on an IC device 320-0. Such an action can include enabling processing sections as described herein. Target values can be retrieved from memory on the same IC device 320-1. Such an action can include retrieving target values from various sources, including NVM circuits or volatile circuits, including but not limited to random access memory (RAM), registers, or other such circuits. Input values can be acquired from a P/DLL circuit 320-2. Such an action can include, but is not limited to, receiving an output signal from a P/DLL circuit, or sensing voltages or currents from portions of a P/DLL circuit, or generating voltages or currents from portions of a P/DLL circuit.

A method 320 can then generate the bits of a multi-bit calibration value. A method 320 can start with an MSB of a calibration value 320-3. A current bit can be initially set to one value (1 in this embodiment) 320-4. A target value can be set 320-5. It is noted that in some embodiments, a target value can change with each calibration bit to be set. An input value can be compared to a target value 320-6. If a comparison yields one result, a current bit can changed (to 0 in this embodiment) 320-7. If a comparison yields another result, a check can be made to see if a last bit (e.g., LSB) has been reached 320-8. If a last bit has not been reached, a method can proceed to a next less significant bit 320-9, and repeat actions 320-4 to 320-8. When a last bit has been reached, the calibration bits can be stored in a memory of the IC device 320-10 (in this case, stored in an NVM circuit of the same IC device).

While embodiments anticipate the calibration of various aspects of P/DLL circuit, in particular embodiments, a device can provide any or all of the following calibrations: frequency calibration, charge pump current (i.e., slope) calibration, RC network calibration, or loop gain calibration.

Figure 4:
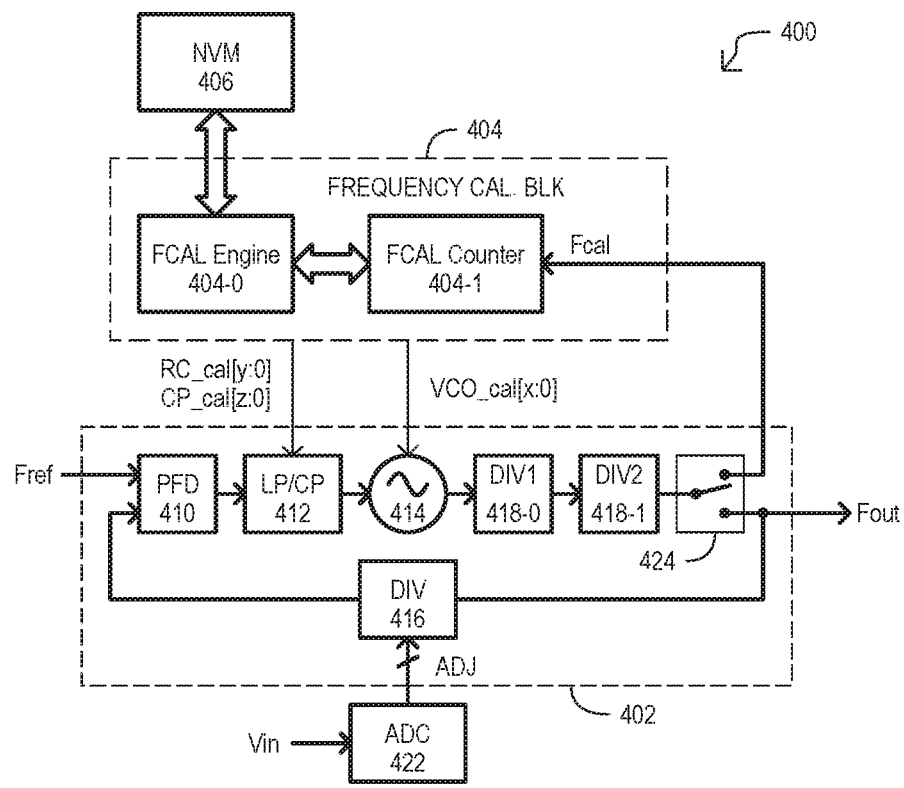
FIG. 4 is a block diagram showing an IC device having a phase lock loop circuit with frequency calibration according to an embodiment.

FIG. 4 is a block diagram of a device 400 according to another embodiment. A device 400 can differ from that of FIG. 2 in that it can include a PLL circuit 402 having a PFD 410, that feeds into a charge pump (CP)/low pass filter (LPF) 412, an oscillator 414 can be a voltage controlled crystal oscillator (VCO) 414, a feedback circuit 416 can be frequency divider that changes a dividing value in response to an adjust value (ADJ). In addition, two voltage dividers 418-0/1 can be included after the output of VCO 414 to generate an output signal Fout. PLL circuit 402 can also include an analog-to-digital converter (ADC) 422 that can convert an input voltage Vin into a digital value ADJ, which can the set a divider value for feedback circuit 416. In particular embodiments, an ADC 422 can be a delta-signal type ADC, more particularly, a one-bit delta-sigma ADC. PLL circuit 402 can also include a calibration switch 424, which can switch an output from VCO 414 to processing section 404, or to a feedback path.

A processing section 404 can include a calibration engine 404-0 and a counter circuit 404-1, and other circuits as will be described in more detail below. A calibration engine 404-0 can generate calibration values as described herein or equivalents. Further, calibration engine 404-0 can take the form of any of the processing circuits described herein, including a processor executing instructions, logic circuits, or combinations thereof.

Referring still to FIG. 4, a processing section 404 can provide digital calibration values to CP/LPF 412 as well as to VCO 414. Calibration values VCO_cal[x:0] can adjust a frequency of VCO, to calibrate a frequency response for the PLL 402. Calibration values CP_cal[z:0] can be applied to charge pump circuits for a slope type calibration and/or a loop gain type calibration. Calibration values RC_cal[y:0] can adjust an impedance of an RC network in LPF or other filters of the device 400.

Referring still to FIG. 4, frequency calibration according to an embodiment will now be described. A frequency calibration operation can reduce initial frequency error that could be present in a PLL 402. A calibration engine 404-0 can retrieve a target value for a desired frequency for the VCO 414. In some embodiments, there can be various such values (each corresponding to a different desired frequency) stored in NVM circuits 406. Target values can take the form of target count values.

A calibration engine 404-0 can place PLL 402 in a calibration mode, or confirm it is in a calibration mode. In a calibration mode, PLL 402 can have calibration switch 424 as shown in FIG. 4. In addition, VCO 414 can have programmable elements set to some predetermined setting. In a particular embodiment, VCO 414 can have a programmable capacitance that is set to some initial value. PLL 402 can then oscillate, generating a periodic signal Fcal that is applied to counter circuit 404-1.

A calibration engine 404-0 can activate counter circuit 404-1 to acquire a calibration count value based on Fcal over a reference time period (which can be based on a reference clock). Based on differences between the calibration count value(s) and target value(s), calibration engine can generate a multi-bit frequency calibration value that can then be applied to VCO 414 to provide a desired performance. In very particular embodiments, a VCO can include a programmable capacitance that can be set by a calibration value.

Figure 5:
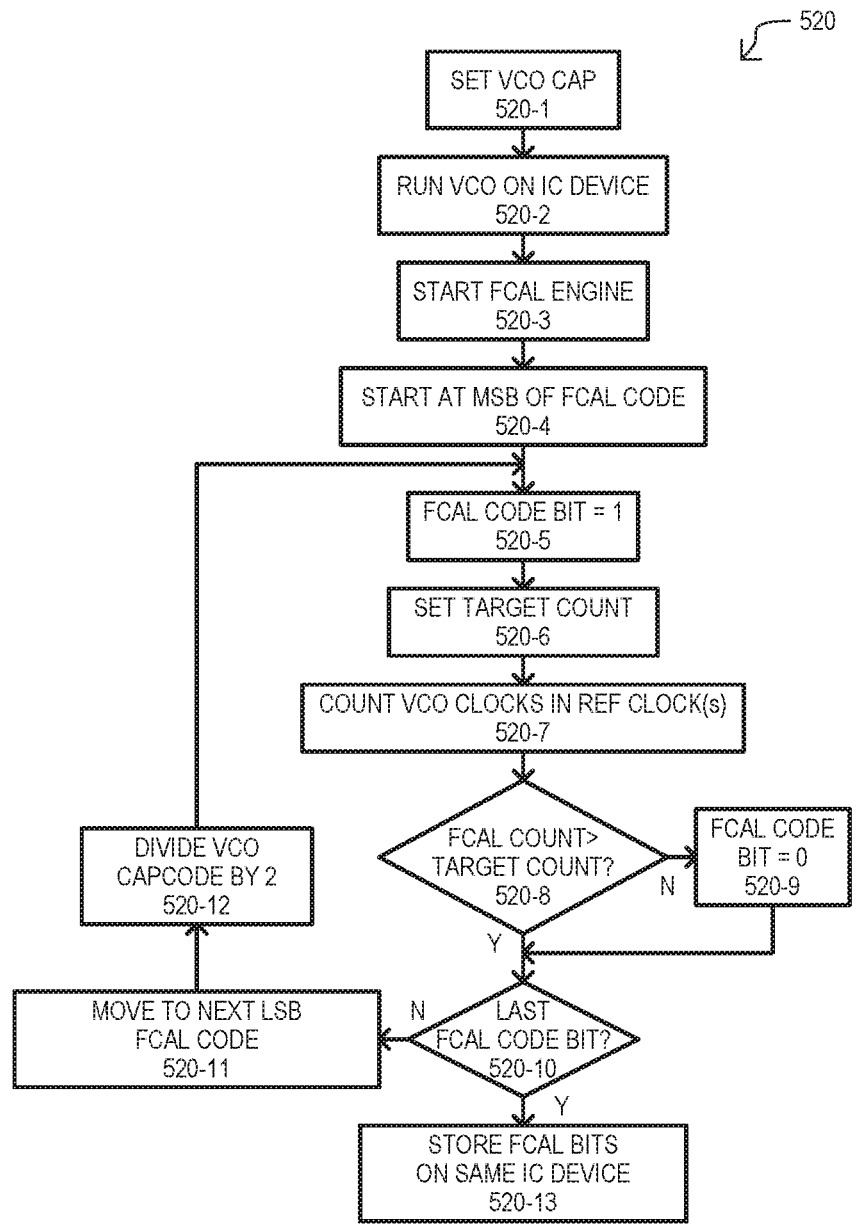
FIG. 5 is a flow diagram of a method of generating frequency calibration bit values according to an embodiment.

In particular embodiments, a calibration engine 404-0 can utilize an SAR type method to generate a frequency calibration value. FIG. 5 shows such a method according to one embodiment.

FIG. 5 is a flow diagram of a method 520 of calibrating a VCO PLL frequency according to one particular embodiment. A method 520 can include setting an initial VCO capacitance 520-1. Such an action can include setting a programmable capacitance of a VCO by application of a "capcode". In particular embodiments, a capcode can be a binary value, and a VCO capacitance can vary according to a capcode. A VCO can be started on an IC device 520-2. In some embodiments, such an action can include starting up a VCO and applying the resulting oscillating output to a counter circuit. A calibration engine can be started 520-3. Such an action can include enabling calibration circuits to sample portions of a PLL. In particular embodiments, such an action can include configuring counting circuits to count a number of PLL cycles occurring in one or more reference cycles.

A method 520 can then generate the bits of a multi-bit frequency calibration value. A method 520 can start with an MSB of a frequency calibration value 520-4. A current bit can be initially set to one value 520-5. A target count value can then be set 520-6. Such an action can include reading a target count value from an NVM based on a desired frequency, as noted above. A number of VCO signal clocks can be counted over a number of reference clock(s) 520-7 to generate a calibration count value (FCAL). A calibration count value can be compared to a target value 520-8. If a comparison yields one result, a current bit can be changed 520-9. If a comparison yields another result, a check can be made to see if a last bit has been reached 520-10. If a last bit has not been reached, a method can proceed to a next less significant bit 520-11. A VCO capacitance setting code can be halved 520-12. Actions 520-5 to 520-12 can be repeated. When a last bit has been reached, the frequency calibration bits can be stored in a memory of the IC device 520-13 (in this case, an NVM circuit of the same IC device).

Figure 6:
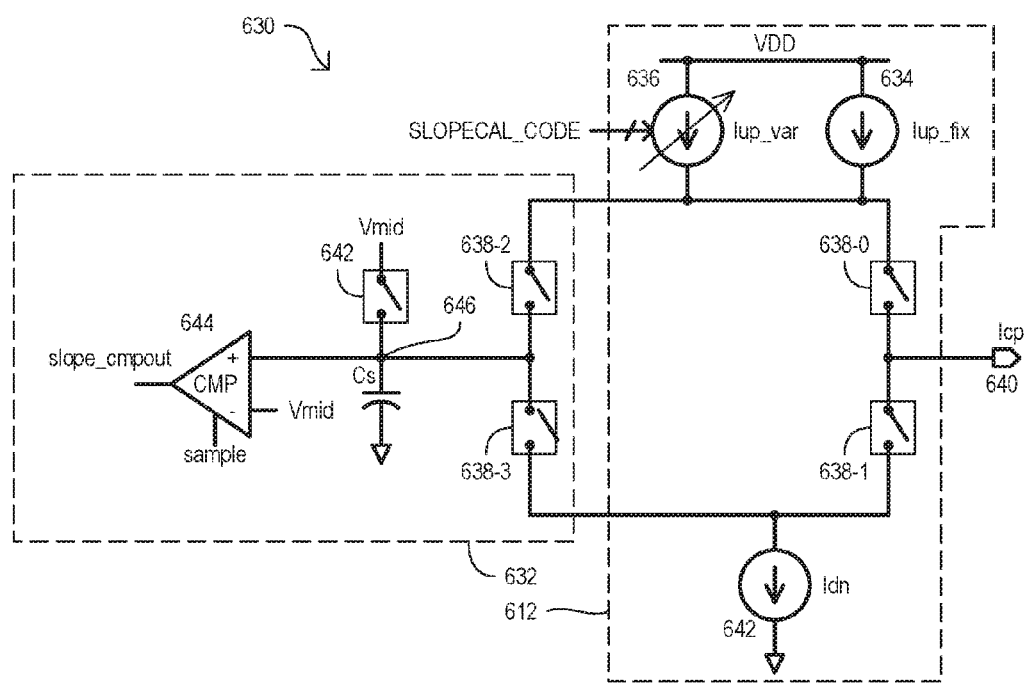
FIG. 6 is a block schematic diagram showing a charge pump slope calibration arrangement for a PLL or delay lock loop (P/DLL) circuit according to an embodiment.

Referring now to FIG. 6, a "slope" calibration arrangement for a device according to an embodiment will now be described. Slope calibration circuits can help set a charge pump current for charge pump circuits that generate a current used to create a difference voltage for a VCO, like a CP/LPF (such as 412 shown in FIG. 4, as but one example).

FIG. 6 shows a slope calibration arrangement 630 that can be included in embodiments. Slope calibration arrangement 630 can include a charge pump circuit 612 and a slope sample circuit 632. A charge pump circuit 612 can include a pump up fixed current source 634, a programmable current source 636, and a sink current source 641. A pump up switch 638-0 can be connected between current sources 634/636 and a pump output 640. A pump down switch 638-1 can be connected between pump output 640 and sink current source 641. Programmable current source 636 can provide a current that varies in response to a calibration value SLOPECAL_CODE.

In operation, charge pump circuit 612 can source a current to pump output 640 having a magnitude based on current sources 634/636 when switch 638-0 is closed. Conversely, charge pump circuit 612 can sink a current from pump output 640 with current source 641 when switch 638-1 is closed. In particular embodiments, charge pump circuit 612 can be included in a CP/LPF section of a PLL.

A slope sample circuit 632 can sample a response of charge pump circuit 612 in order to generate a slope calibration value (SLOPECAL_CODE). A slope sample circuit 632 can include a pump up switch 638-2, a pump down switch 638-3, a reset switch 642, a sample capacitor Cs, and a comparator 644. A pump up switch 638-2 can be connected between current sources 634/636 and a sample node 646. A pump down switch 638-3 can be connected between sample node 646 and sink current source 641. A reset switch 642 can apply a target voltage (Vmid) to sample node 646. Sample capacitor Cs can be connected between sample node 646 and ground. A comparator 644 can have a first input connected to sample node 646 and a second input connected to a target voltage (Vmid).

In operation, a slope sample circuit 632 can be initialized by pump up/down switches 638-2/3 being open, and reset switch 642 being closed, applying Vmid to both inputs of comparator 644. Pump up switches 638-2 (and optionally pump down switch 638-3) can be enabled to charge sample capacitor Cs. Based on such charging, a voltage can develop at sample node 646. In response to a sample signal, a comparator output signal (slope_compout) can be driven low or high, based on a comparison between a voltage on sample node 646 and voltage Vmid, to generate a compare result. Such a comparison operation can be performed to generate each bit of a slope calibration value. In some embodiments Vmid can vary in each such compare operation.

In particular embodiments, a slope sample circuit 632 can be included in calibration circuits, like those shown as 104-1 in FIG. 1.

In some embodiments, pump up current sources can be formed by PMOS transistors and pump down current sources can be formed with NMOS transistors. Calibration of a current provided by one or both such current sources can make a charge pump response more linear, which can avoid noise fold-over at high frequencies.

Figure 7:
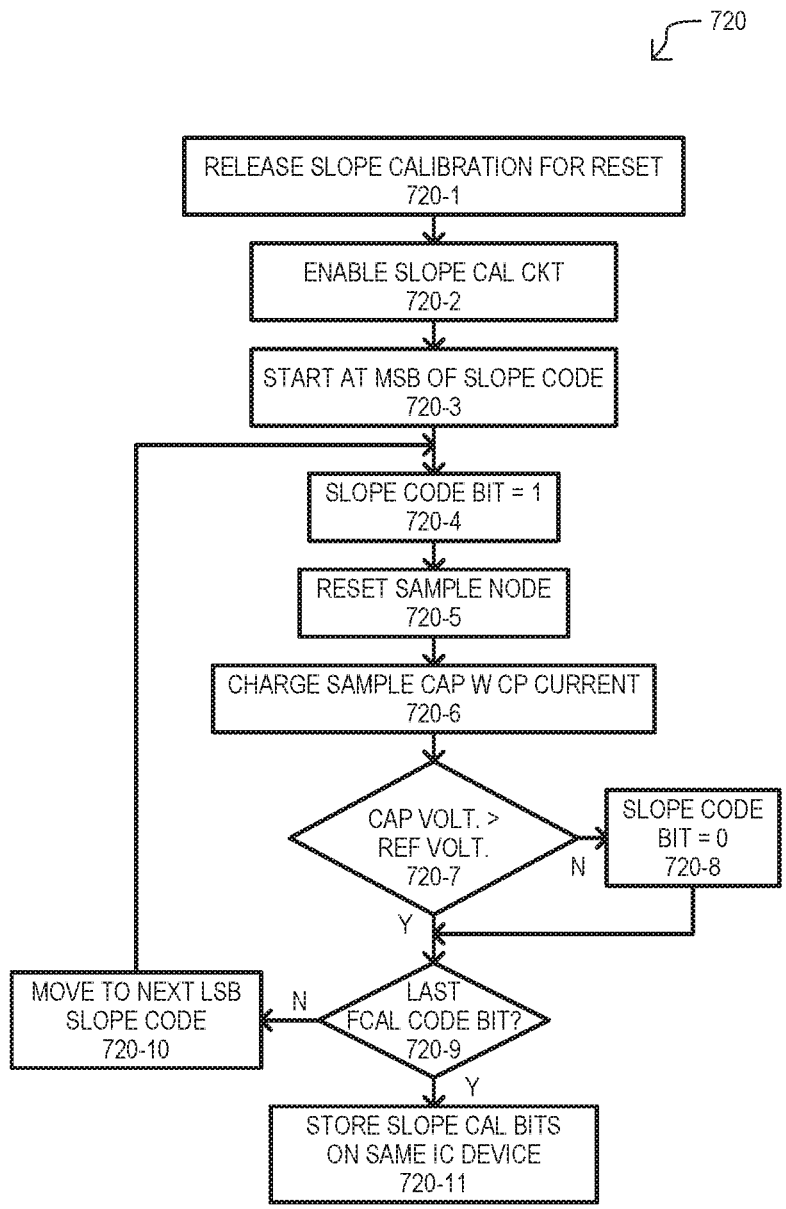
FIG. 7 is a flow diagram of a method of generating slope calibration bit values according to an embodiment.

In particular embodiments, a slope calibration operation can utilize an SAR type method to generate a slope calibration value. FIG. 7 shows such a method according to one embodiment.

FIG. 7 is a flow diagram of a method 720 of PLL charge pump slope calibration according to one particular embodiment. A method 720 can include releasing a slope calibration for reset 720-1. Such an action can include enabling logic and/or programs to generate a slope calibration value, and/or registers to store a new slope calibration value. A slope calibration circuit can be enabled 720-2. Such an action can include activating state machine, or other logic to enable a sampling of a CP current (e.g., activate switches 630-2/3, 642, sample signal, Vmid values).

A method 720 can then generate the bits of a multi-bit slope calibration value. A method 720 can start with an MSB of a slope calibration value 720-3. A current bit can be initially set to one value 720-4. A sample node can be reset 720-5. Such an action can include setting inputs of a comparator to a same value (e.g., Vmid). A sample capacitor can be charged 720-6. Such an action can include charging a capacitor based on a current that is programmable. A sample node voltage can be compared to a target value (Vmid) 720-7. If a comparison yields one result, a current bit can be changed 720-8. If a comparison yields another result, a check can be made to see if a last bit has been reached 720-9. If a last bit has not been reached, a method can proceed to a next less significant bit 720-10. Actions 720-4 to 720-10 can be repeated. When a last bit has been reached, the slope calibration bits can be stored in a memory of the IC device 720-11 (in this case, an NVM circuit of the same IC device).

Figure 8:
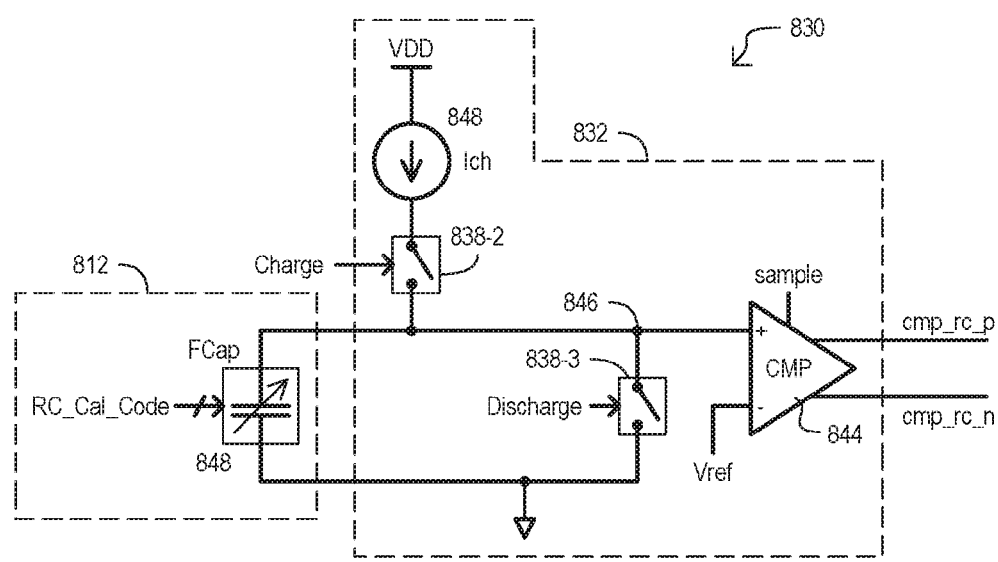
FIG. 8 is a block schematic diagram showing a resistor-capacitor (RC) network calibration arrangement for a P/DLL circuit according to an embodiment.

FIG. 8 shows an RC network calibration arrangement 830 that can be included in embodiments. RC calibration arrangement 830 can include an RC network 812 and an RC sample circuit 832. RC network 812 can include a programmable capacitance 848 that can provide a variable capacitance in response to a calibration value RC_Cal_Code. In particular embodiments, an RC network 812 can be included in a CP/LPF section of a PLL.

An RC sample circuit 832 can sample a response of an RC network 848 to generate an RC calibration value (RC_Cal_Code). An RC sample circuit 832 can include charge current source 848, a sample charge switch 838-2, a sample discharge switch 838-3, and a comparator 844. A sample charge switch 838-2 can be connected between charge current source 848 and a sample node 846. A sample discharge switch 838-3 can be connected between sample node 846 and ground. A comparator 844 can have a first input connected to sample node 846 and a second input connected to receive a reference voltage (Vref).

In operation, an RC sample circuit 832 can be initialized by sample discharge switch 838-3 being closed and sample charge switch 838-2 being open. A sample operation can begin by sample discharge switch 838-3 opening and sample charge switch 838-2 closing, which can charge sample node 846 at a rate that varies according to RC network 812 and charge current source 848. In response to a sample signal, comparator output signals (cmp_rc_p, cmp_rc_n) can be driven low or high, based on a comparison between a voltage on sample node 846 and voltage Vref. Such a comparison operation can be performed to generate each bit of a slope calibration value. In some embodiments Vref can vary in each such compare operation.

In particular embodiments, an RC sample circuit 832 can be included calibration circuits, like those shown as 104-1 in FIG. 1. Further, an RC sample circuit 832 can calibrate other programmable values on other analog filters of a P/DLL circuit, or multiple such circuits can be included in a same IC device.

Figure 9:
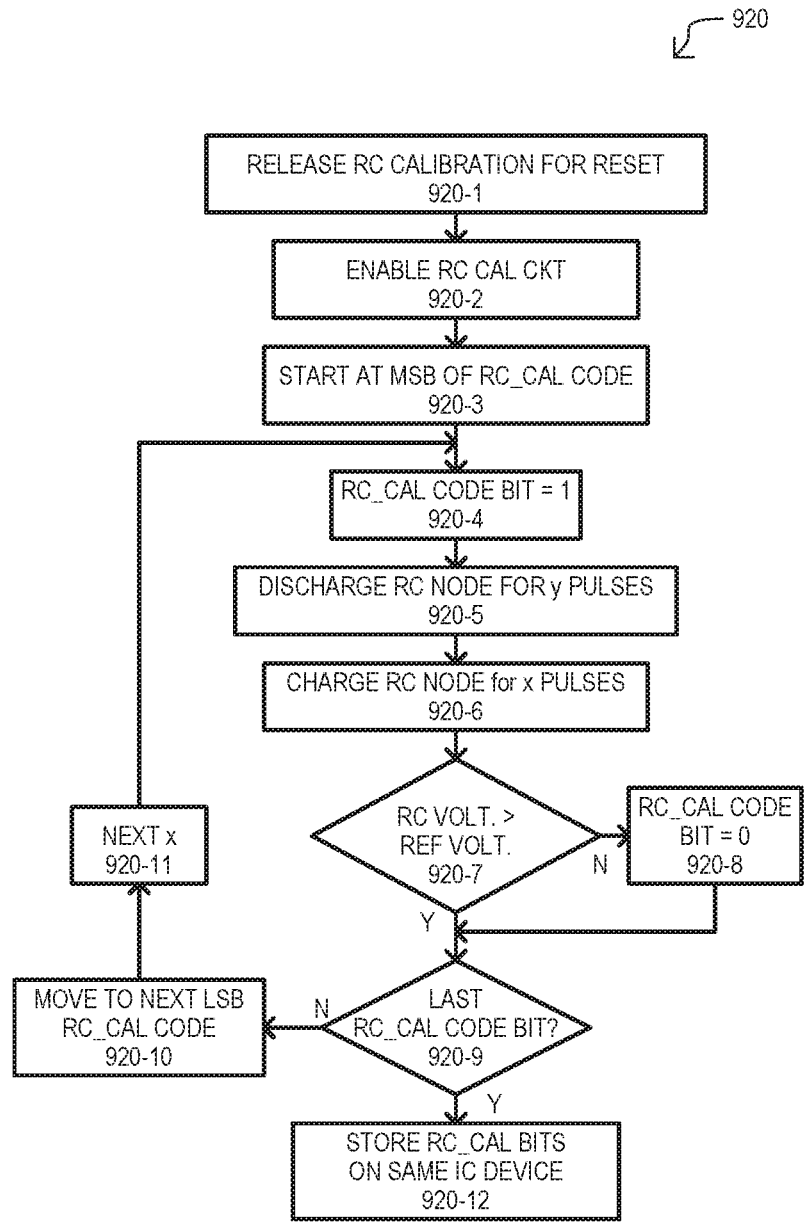
FIG. 9 is a flow diagram of a method of generating RC network calibration bit values according to an embodiment.

In particular embodiments, an RC network calibration operation can utilize an SAR type method to generate an RC calibration value. FIG. 9 shows such a method according to one embodiment.

FIG. 9 is a flow diagram of a method 920 of P/DLL RC network calibration according to one particular embodiment. A method 920 can include releasing an RC calibration for reset 920-1. Such an action can include enabling logic and/or programs to generate an RC calibration value, and/or registers to store a new RC calibration value. An RC calibration circuit can be enabled 920-2. Such an action can include activating state machine, or other logic to enable a sampling of a voltage generated across an RC network (e.g., activate switches 838-2/3, sample signal, Vref values).

A method 920 can then generate the bits of a multi-bit slope calibration value. A method 920 can start with an MSB of a slope calibration value 920-3. A current bit can be initially set to one value 920-4. A sample node can be discharged 920-5. In the particular embodiment shown, such a discharge operation can last for y pulses. A sample node can then be charged 920-6. In the particular embodiment shown, such a charge operation can last for x pulses. Such an action can result in a charging of an RC network being sampled. A sample node voltage can be compared to a reference voltage (Vref) 920-7. If a comparison yields one result, a current bit can be changed 920-8. If a comparison yields another result, a check can be made to see if a last bit has been reached 920-9. If a last bit has not been reached, a method can proceed to a next less significant bit 920-10, and a next x value 920-11. Actions 920-4 to 920-11 can be repeated. When a last bit has been reached, the RC calibration bits can be stored in a memory of the IC device 920-12 (in this case, an NVM circuit of the same IC device).

According to embodiments, a calibration engine can be used to arrive at calibration values that can result in charge pump current that can cause a loop-gain of a PLL to be essentially constant, regardless of process parameter variations. Briefly, measurements of open loop VCO frequency can be taken at two instances. A first measurement can be taken with default settings and second measurement can be taken with a fixed charge pump current. The fixed charge pump current can be in a proportional path (i.e., a path that can vary in response to phase/frequency difference). The difference between the two measurements can be used to arrive at a scaling factor. A scaling factor can be used to scale charge pump calibration values. In very particular embodiments, a calculation of a scaling factor can be performed by application firmware executed by a processor that uses data stored in NVM circuits of the same device.

Figure 10A:
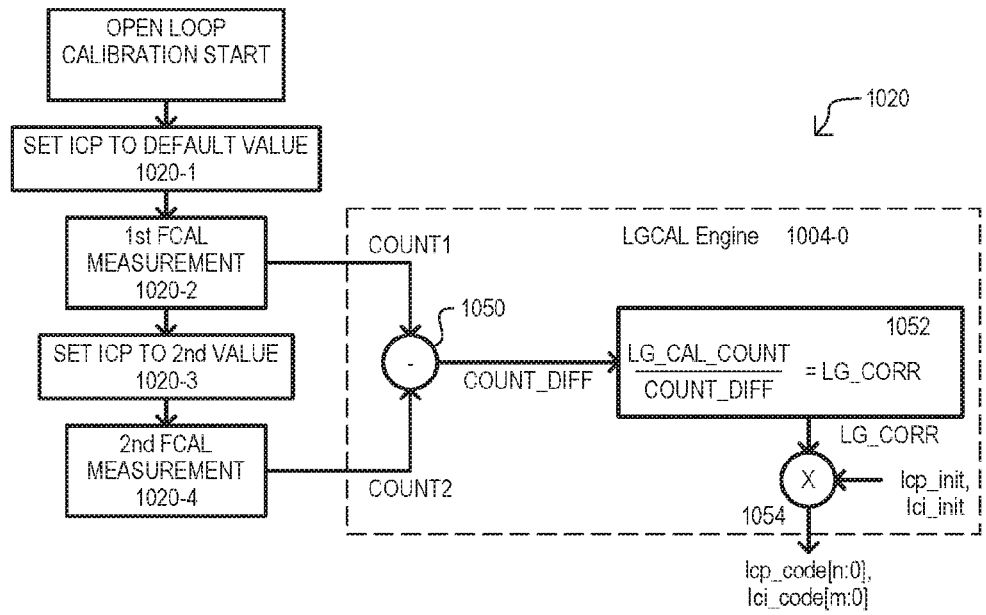
FIGS. 10A and 10B are diagrams showing an IC device and methods for PLL loop-gain calibration according to embodiments.
Figure 10B:
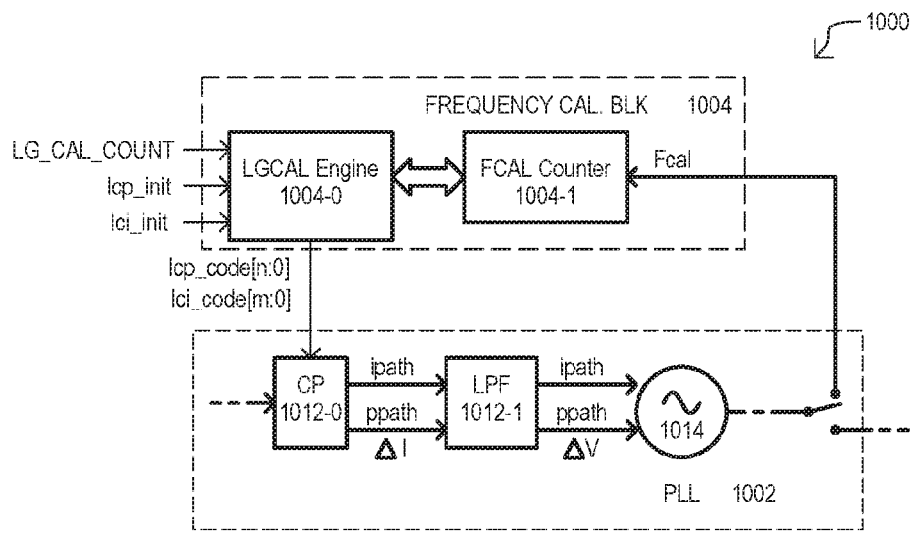

FIGS. 10A and 10B are diagrams showing an open loop gain calibration for a PLL circuit according to embodiments. FIG. 10A is a diagram showing a loop-gain calibration value generation method 1020, and FIG. 10B is a diagram showing one example of a device 1000 that can execute such a loop-gain calibration method.

Referring to FIG. 10A, a method 1020 can include setting a charge pump current (ICP) to a default value 1020-1. At such a setting, a PLL can be operated in an open loop fashion to generate a signal FCAL. A count value (COUNT1) can be generated based on such a signal 1020-2. ICP can then be set to a second value 1020-3. At this second setting, a PLL is operated in an open loop fashion again to generate a different FCAL. A second count value (COUNT2) can be generated based on such a signal 1020-4.

A loop-gain calibration engine 1004-0 can determine a difference (COUNT_DIFF) between the COUNT1 and COUNT2 values 1050. Based on COUNT_DIFF and a loop-gain calibration value (LG_CAL_COUNT), a loop-gain calibration engine 1004-0 can generate a scaling factor LG_CORR. A scaling factor (LC_CORR) can be applied to charge pump current control values (Icp_init, ici_init) 1054, to generate loop-gain calibration values (Icp_code[n:0], Ici_code[m:0]).

While a loop-gain calibration engine 1004-0 can take various forms, as noted above, in particular embodiments, a loop-gain calibration engine 1004-0 can be a processor executing code (e.g., firmware) stored on the same IC device.

FIG. 10B is a block diagram of a device 1000 according to another embodiment. A device 1000 can differ from that of FIG. 4 in that PLL circuit 1002 shows a charge pump 1012-0 separate from a LPF 1012-1. Charge pump 1012-0 can receive loop-gain calibration values (Icp_code[n:0], Ici_code[m:0]), and generate a charge pump current that can vary ΔI in response to a phase/frequency difference. In the particular embodiment shown, a generated current can have a proportional component ppath and another (e.g., integral) component ipath. From a charge pump current ΔI LPF 1012-1 can generate a difference voltage ΔV. Difference voltage ΔV can also be conceptualized as having a proportional ppath and other path. In response to difference voltage ΔV, VCO 1014 can generate an output signal Fcal.

A processing section 1004 can include a calibration engine 1004-0 and a counter circuit 1004-1. A calibration engine 1004-0 can receive a loop-gain calibration value (LG_CAL_COUNT), and initial charge pump current values Icp_init, Ici_init. In some embodiments, such values can be stored in NVM circuits of a same IC device. Calibration engine 1004-0 can take the form of any of the processing circuits described herein, including a processor executing instructions, logic circuits, or combinations thereof.

Referring still to FIG. 10B, in a loop-gain calibration operation, PLL 1002 can be enabled to generate an open-loop signal Fcal with charge pump 1012-0 operating at default values. As shown, Fcal can be applied to counter circuit 1004-1. A calibration engine 1004-0 can activate counter circuit 1004-1 to acquire a first count value (COUNT1). Second charge pump control values can then be applied to charge pump 1012-0 to generate a second open-loop signal Fcal. A calibration engine 1004-0 can activate counter circuit 1004-1 to acquire a second count value (COUNT2).

Using the two count values COUNT1/2, as well as the loop-gain calibration value (LG_CAL_COUNT) and initial charge pump current values Icp_init, Ici_init, calibration engine 1004-0 can generate loop-gain calibration values (Icp_code[n:0], Ici_code[m:0]) as described herein, or in an equivalent fashion.

While embodiments can include calibration devices and methods as disclosed above, additional embodiments can include methods that execute such calibration operations in response to predetermined events, including upon power-up, reset, or receiving new calibrations values from a source external to an IC device containing the P/DLL circuit.

According to embodiments, a processing section (which can include a processor and NVM in some embodiments) can execute operations based on external inputs. In particular embodiments, this can include a processor storing and running application firmware from NVM circuits, and also selecting a desired configuration (out of several configurations stored in the NVM, referred herein as "profiles") based on an external interrupt generated based on an input pin setting change.

Such operations (e.g., application firmware) can perform any or all of the following: initialize the P/DLL and other common settings, detect change in the configuration based on an external input (e.g., interrupt), identify and validate any profile change request and new configuration data (e.g., calibration values), load new configuration data into the registers in correct defined sequence, sleep and wait for next event (e.g., interrupt), and periodically wake to check for configuration changes/change requests. One such embodiment is shown in FIG. 11.

Figure 11:
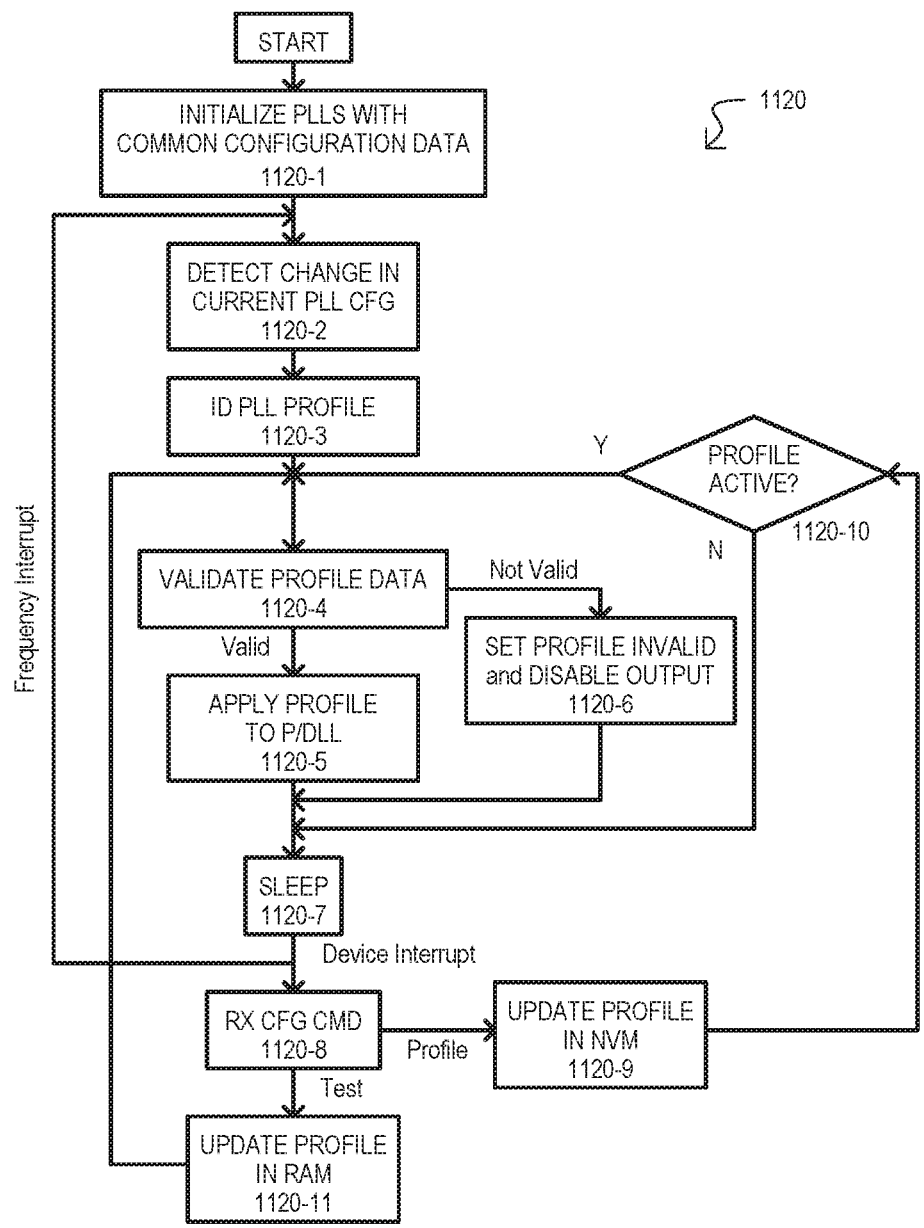
FIG. 11 is a flow diagram of a calibration method for a device having P/DLL circuits according to an embodiment.

FIG. 11 is a flow diagram of a method 1120 according to an embodiment. A method 1120 can include initializing PLL (or DLL) circuits with common configuration data 1120-1. Such an action can include starting PLL circuit with default calibration values. Such calibration values can include any or all such values described herein, or equivalents. A method 1120 can detect if changes are to be applied to a PLL circuit configuration 1120-2. Such an action can include applying new calibration values generated according to any of the methods described herein, or equivalents. In the embodiment shown, PLL circuit configurations can have profiles. That is, a profile can include configuration values generated for a particular PLL performance. A method 1120 can identify the profile 1120-3.

A profile can be validated 1120-4. In some embodiments, such an action can include executing a checksum or other error detection/correction on the profile data. If a profile is valid, a P/DLL circuit can be configured according to the profile 1120-5. Such an action can include applying calibration values to a P/DLL circuit as described herein or equivalents. If a profile is determined not to be valid, the profile can be indicated as invalid, and its output to any P/DLL circuit can be disabled 1120-6.

A method 1120 can include placing a device in a sleep mode 1120-7.

In response to predetermined events, a device can be woken from a sleep mode. In the embodiment shown, such events can include a frequency interrupt, which can return a method 1120 to 1120-2 after a predetermined amount of time has passed. In addition, such events can include receiving a configuration command 1120-8. If a received command is for a new profile, the profile can be updated in a memory of the device 1120-9 (which can be NVM circuits in the embodiment shown). If the profile is to be an active profile (1120-10), a method can return to 1120-4. If a profile is not an active profile (1120-10), a method can return to 1120-7 (i.e., go back to sleep). If a received command is for a test profile, the profile can be updated in a memory of the device 1120-11 (which can be a RAM in the embodiment shown). A method can then return to 1120-2.

Figure 12:
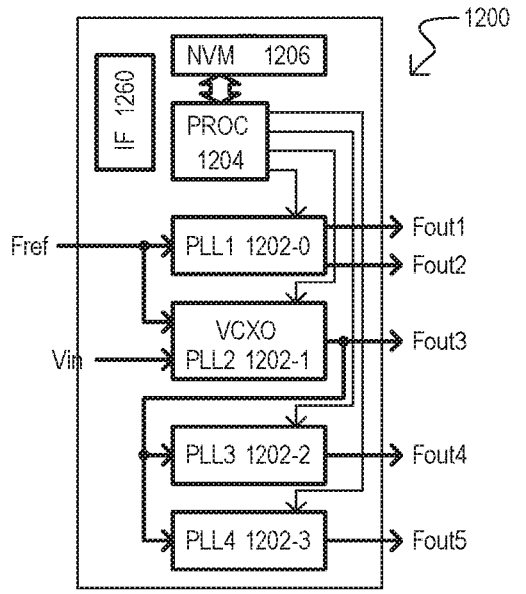
FIG. 12 is a block diagram of an IC device according to a further embodiment.

FIG. 12 is a block schematic diagram of a device 1200 according to a further embodiment. A device 1200 can include a processing section 1204 and NVM circuits 1206 as described for other embodiments or equivalents.

Unlike other figures, a device 1200 further shows four PLL circuits 1202-0 to -3, as well as an interface 1260. PLL 1202-0 can receive a reference signal Fref, and in response, generate two output signals Fout1, Fout2. A second PLL 1202-1 can include a crystal based VCO, and can vary an output signal Fout3 in response to an input voltage Vin. Third and fourth PLLs 1202-2/3 can receive an output from second PLL 1202-1 as an input signal, and can generate output signals Fout4 and Fout5, respectively. While any or all PLLs (1202-0 to -3) can be configured with calibration values as described herein, in one embodiment second PLL 1202-1 can take the form of an embodiment like that shown in any of FIG. 1, 2, 4 or 10A/B.

An interface 1260 can be any suitable interface. However, in some embodiments, an interface 1260 can be a serial communication interface. In particular embodiments, an interface can be compatible with the I2C serial communications standard.

In some embodiments, an interface 1260 can be a slave interface, and a device 1200 can recognize predetermined commands and execute them. As noted above, in some embodiments, execution of the commands can include a processor executing stored instructions (e.g., firmware). Such instructions can include, but are not limited to, configure a D/PLL circuit using configuration/calibration values stored in NVM circuits of the same IC device, configure a D/PLL circuit using configuration/calibration values stored in volatile memory circuits of the same IC device, read status and profile information for D/PLL circuits, and writing configuration/calibration values to NVM memory circuits of the same IC device.

Figure 13:
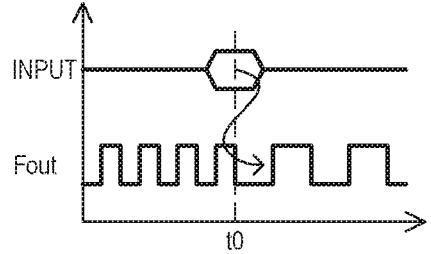
FIG. 13 is a timing diagram showing a P/DLL configuration on-the-fly change according to an embodiment.

As noted above, in some embodiments a device can change calibration values on the fly to change a resulting output signal. FIG. 13 is a timing diagram showing such an operation.

FIG. 13 shows an input (INPUT) and a resulting output signal Fout. An input can take the form of any suitable input to an IC device, including a command or signal level. As shown, at time t0, a predetermined input is received. As a result, new calibration values are applied to the corresponding P/DLL, resulting in a change in frequency which can include application of calibration values generated for the new frequency.

While embodiments can include IC devices having calibrations circuits and related methods, other embodiments can include larger systems utilizing such calibration capabilities. While such systems can take the form of any suitable system in need of multiple timing signals of different frequencies, by way of example one particular system according to an embodiment will be described with reference to FIG. 14.

Figure 14:
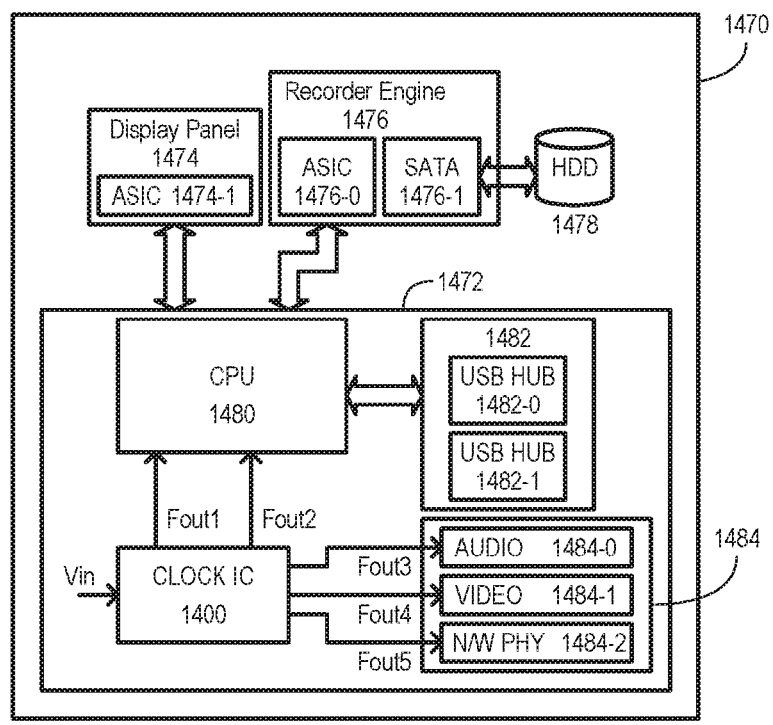
FIG. 14 is a block diagram of a system according to an embodiment.

FIG. 14 is a block schematic diagram of a system 1470 according to an embodiment. A system 1470 can be a television system that can include an IC device 1400 according to any of the embodiments disclosed herein, or equivalents. IC device 1400 can generate five output signals Fout1 to Fout5, and can vary any or all such signals in response to an input value Vin.

A system 1470 can further include a control section 1472, a display section 1474, recording section 1476, and storage media 1478. A control section 1472 can include IC device 1400, a central processing unit 1480, a serial interface 1482, and control circuits 1484. IC device 1400 can provide two timing signals (Fout1/2) to CPU 1480. Serial interface 1482 can be a USB type interface, and can include a USB Hub 1482-0 and USB physical interface 1482-1. Control circuits 1484 can include audio control circuits 1484-0, video control circuits 1484-1, and network communication circuits 1484-2, which can each receive a different timing signal (Fout3, Fout4, and Fout5, respectively).

A display section 1474 can include a display panel 1474 and corresponding control circuit 1474-1. A recording section 1476 can include control circuit 1476-0 and a storage interface 1476-1. A storage media 1478 can be connected to storage interface 1476-1.

Of course, FIG. 14 presents but one system according to a particular embodiment.

Embodiments disclosed herein, which can execute different calibration sequences upon power-up, in response to commands and/or periodically, can adjust for process variation and/even provide added margin as compared to conventional approaches that can require trimming of components. As noted above, in some embodiments, such calibration sequences can be executed by a processor and instructions, which can provide for a flexible and robust solution for applications needing accurate timing signals. Embodiments (and equivalents) herein can thus be utilized to "calibrate out" process sensitivities of a P/DLL or other sensitive circuit with calibration routines, which can be implemented by a processor and instructions (e.g., microcontroller capable of handling firmware instructions).

In very particular embodiments, an IC device can include a processor and NVM, and can provide 12 different kinds of outputs, 8 configuration settings that can be stored at a time and selected on the fly using external interrupts on 3 pins or using a command at an interface (e.g., I2C command).

The usage of a sigma delta based ADC controlling a feedback divider, as noted in conjunction with the embodiment of FIG. 4, can produce a high degree of linearity on the voltage to frequency translation. Embodiments described herein can achieve good jitter performance of 0.7 ps rms, with a relatively lower node of process technology.

Embodiments can include IC devices or circuits that drive multiple reference clocks at different frequencies for any suitable application, including but not limited to: multi-function printers, digital televisions, etc.

It should be appreciated that references throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An integrated circuit (IC) device, comprising:
at least one phase or delay lock loop (P/DLL) circuit comprising a plurality of circuit sections, at least one of the circuit sections responsive to digital calibration values to alter at least one periodic output signal;
a nonvolatile memory (NVM) circuit formed in the same IC package as the at least one P/DLL circuit and configured to store the calibration values; and
a processing circuit formed in the same IC package as the at least one P/DLL circuit and the NVM circuit, the processing circuit configured to generate the calibration values in response to target values and output values from the at least one P/DLL circuit, and to store the calibration values in the NVM circuit.

2. The IC device of claim 1, wherein:
the at least one P/DLL circuit comprises a PLL; and
the at least one circuit section comprises a voltage controlled oscillator (VCO) having at least one programmable VCO element responsive to the calibration values to adjust an oscillation frequency of the VCO.

3. The IC device of claim 2, wherein the processing circuit includes:
a counter circuit coupled to an output of the at least one P/DLL circuit and configured to generate sample count values in response to a periodic value output from the at least one P/DLL; and
logic circuits configured to compare sample count values to target count values to generate the calibration values.

4. The IC device of claim 1, wherein:
the at least one P/DLL circuit comprises a phase or frequency detector (PFD); and
the at least one circuit section comprises a charge pump circuit configured to generate a pump current in response to an output of the PFD, the pump current being variable in response to the calibration values.

5. The IC device of claim 1, wherein:
the at least one circuit section comprises a resistor-capacitor (RC) network configured to vary an impedance in response to the calibration values.

6. The IC device of claim 1, wherein:
the at least one circuit section comprises at least one oscillator stage configured to vary a loop-gain in response to an analog control value, the analog control value varying in response to the calibration values.

7. The IC device of claim 6, wherein the processing circuit includes:
a counter circuit coupled to an output of the at least one P/DLL circuit and configured to generate sample count values in response to a periodic value output from the at least one P/DLL; and
logic circuits configured to generate scaling factors in response to a multiple sample count values and a target count value, and to generate the calibration values by scaling initial calibration values with the scaling factors.

8. The IC device of claim 1, wherein the processing circuit includes:
a compare circuit configured to sequentially compare output values from the at least one P/DLL circuit to target values; and
logic configured to generate each bit of a multi-bit calibration value, starting from a most significant bit to a least significant bit based on the compare results of the compare circuit.

9. The IC device of claim 1, wherein:
the at least one P/DLL circuit, NVM circuit, and processing circuit are formed in the same IC substrate.

10. A system, comprising:
a plurality of phase or delay lock loop (P/DLL) circuits formed in an integrated circuit (IC) device package, and comprising a plurality of circuit sections, at least one of the circuit sections responsive to digital first calibration values to alter at least one periodic output signal from the P/DLL circuits;
a nonvolatile memory (NVM) circuit formed in the IC device package and configured to store the calibration values;
a processing circuit formed in the IC device package, the processing circuit configured to generate the first calibration values in response to target values and output values from the at least one of the P/DLL circuits, and to store the first calibration values in the NVM circuit;
an interface formed in the IC device package and configured to receive commands for controlling the generation of signals from P/DLL circuits; and
a plurality of signal outputs, each providing a different periodic output signal from a corresponding P/DLL circuit.

11. The system of claim 10, further including:
the interface is further configured to receive and decode commands from a source external to the IC device, the command including second calibration values; and
the processing circuit is configured to apply second calibration values received via the interface to at least one P/DLL circuit and store such second calibration values in the NVM circuit.

12. The system of claim 10, wherein:
the interface is further configured to generate an interrupt in response to receiving a command containing calibration values; and
the processing circuit is configured to apply calibration values received via the interface to the at least one P/DLL circuit in response to the interrupt.

13. The system of claim 10, wherein:
the processing circuit comprises
a processor unit, and
processor memory configured to store calibration instructions for configuring the processor unit to generate the calibration value.

14. The system of claim 10, wherein the processing circuit includes:
a compare circuit configured to sequentially compare output values from the at least one P/DLL circuit to target values; and logic configured to generate each bit of a multi-bit calibration value, starting from a most significant bit to a least significant bit based on the compare results of the compare circuit.

15. The system of claim 10, wherein the at least one circuit section is selected from the group of:
  a voltage controlled oscillator (VCO) having at least one programmable VCO element responsive to the calibration values to adjust an oscillation frequency of the VCO;
  a charge pump circuit configured to generate a pump current in response to an output of a phase of frequency detector, the pump current being variable in response to the calibration values;
  a resistor-capacitor (RC) network included in a filter section, and configured to vary an impedance in response to the calibration values; and
  at least one oscillator stage configured to vary a loop-gain in response to an analog control value, the analog control value varying in response to the calibration values.

16. A method, comprising:
  providing output values from at least one circuit section of a phase or delay lock loop (P/DLL) circuit formed in an integrated circuit (IC) package;
  generating calibration values with a processing circuit by comparing the output values from the P/DLL circuit to target values, the processing circuit being formed in the same IC package;
  applying the calibration values to vary a periodic output signal generated by the P/DLL circuit; and
  storing the calibration values in a nonvolatile memory (NVM) circuit formed in the same IC package.

17. The method of claim 16, wherein:
  the P/DLL circuit comprises a PLL circuit having a voltage controlled oscillator (VCO);
  providing the output values includes providing count values generated from a periodic signal generated by at least the VCO;
  generating the calibration values includes comparing the count values with target count values to generate the calibration values; and
  applying the calibrations values to a programmable capacitance in the VCO.

18. The method of claim 16, wherein:
  the at least one circuit section comprises a charge pump;
  providing the output values includes providing a charge pump current from a programmable current source;
  generating the calibration values includes comparing a sample voltage generated by the charge pump current to a reference voltage; and
  applying the calibrations values to the programmable current source.

19. The method of claim 16, wherein:
  providing the output values includes any selected from:
    generating a sample voltage corresponding to the programmable capacitance; and
    providing count values generated from a periodic signal generated by the P/DLL circuit;
  generating the calibration values includes any selected from:
    applying the calibrations values to set the capacitance of a programmable filter capacitance; and
    applying the calibrations values to the P/DLL circuit to vary a loop-gain of the P/DLL circuit.

20. The method of claim 16, further including:
  storing the target values in the NVM circuit.

* * * * *